US 011502716B2

(12) United States Patent
Kumar et al.

(10) Patent No.: US 11,502,716 B2
(45) Date of Patent: Nov. 15, 2022

(54) ON-OFF KEYING RECEIVERS

(71) Applicant: TEXAS INSTRUMENTS INCORPORATED, Dallas, TX (US)

(72) Inventors: Viswanathan Venkatesh Kumar, Bengaluru (IN); Deep Banerjee, Bengaluru (IN); Shishir Goyal, Bengaluru (IN); Sreeram Nasum Subramanyam, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/123,915

(22) Filed: Dec. 16, 2020

(65) Prior Publication Data

US 2022/0190866 A1    Jun. 16, 2022

(51) Int. Cl.
  *H04B 1/40*  (2015.01)
  *H04B 3/56*  (2006.01)
  *H04B 3/54*  (2006.01)
  *H03K 5/24*  (2006.01)

(52) U.S. Cl.
  CPC ............... *H04B 1/40* (2013.01); *H03K 5/24* (2013.01); *H04B 3/542* (2013.01); *H04B 3/56* (2013.01)

(58) Field of Classification Search
  CPC . H04B 1/40; H04B 3/542; H04B 3/56; H03K 5/24
  See application file for complete search history.

(56) References Cited

U.S. PATENT DOCUMENTS

| 4,019,147 A * | 4/1977 | Blomenkamp ........ G01R 29/02 327/557 |
| 4,852,080 A * | 7/1989 | Ohtake .................. H04M 11/06 370/295 |
| 6,429,733 B1 | 8/2002 | Pagliolo et al. |
| 2007/0035414 A1 | 2/2007 | Welles, II et al. |
| 2007/0242735 A1 | 10/2007 | Harjani et al. |
| 2011/0064126 A1* | 3/2011 | Ishiko .................... H04B 3/544 375/222 |
| 2015/0263686 A1 | 9/2015 | Lesso |
| 2017/0104508 A1* | 4/2017 | Mukundagiri ....... H04B 5/0031 |
| 2019/0182555 A1 | 6/2019 | Olson et al. |
| 2019/0386703 A1* | 12/2019 | Rajapaksha ......... H04L 27/0002 |

OTHER PUBLICATIONS

Written Opinion of the International Searching Authority, Application No. PCT/US2021/063191, dated Mar. 31, 2022, 5 pgs.

(Continued)

*Primary Examiner* — David B Lugo
(74) *Attorney, Agent, or Firm* — John R. Pessetto; Charles A. Brill; Frank D. Cimino

(57) ABSTRACT

An on-off keying (OOK) receiver circuit includes a band-pass filter and an envelope detector. The band-pass filter includes a high-pass filter, a low-pass filter, and a switch. The high-pass filter is configured to filter an OOK input signal. The low-pass filter is configured to filter an output signal of the high-pass filter. The switch is coupled to an output of the high-pass filter, and is configured to, with each cycle of the OOK input signal, dissipate energy stored in the band-pass filter. The envelope detector is configured to receive a filtered OOK input signal from the band-pass filter, and to generate an OOK output signal based on the filtered OOK input signal.

16 Claims, 7 Drawing Sheets

(56) References Cited

OTHER PUBLICATIONS

International Search Report, Application No. PCT/US2021/063191, dated Mar. 31, 2022, 2 pgs.
Notification of Transmittal of the International Search Report and the Written Opinion of the International Searching Authority, or the Declaration, Application No. PCT/US2021/063191, dated Mar. 31, 2022, 1 pg.

* cited by examiner

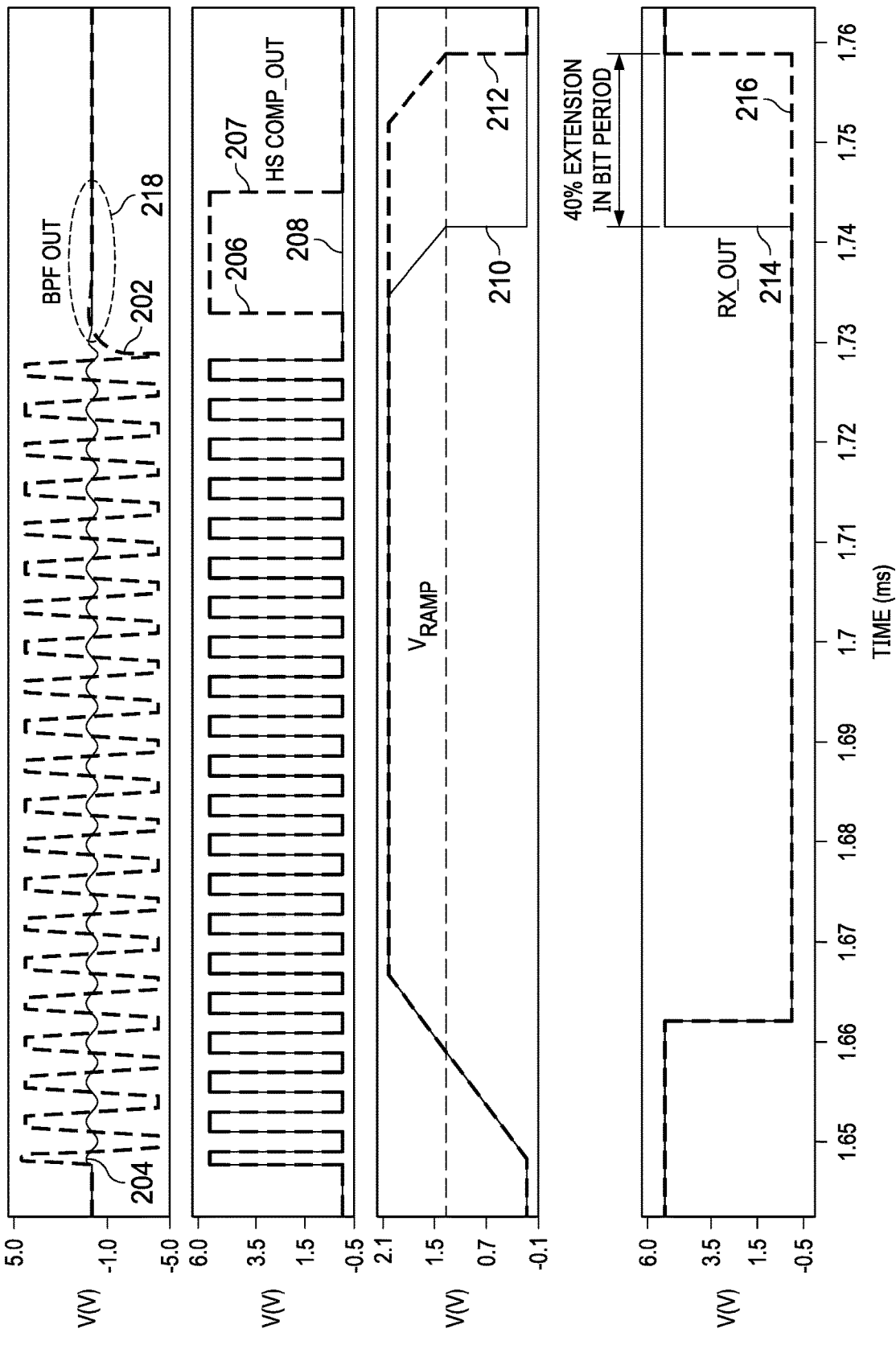

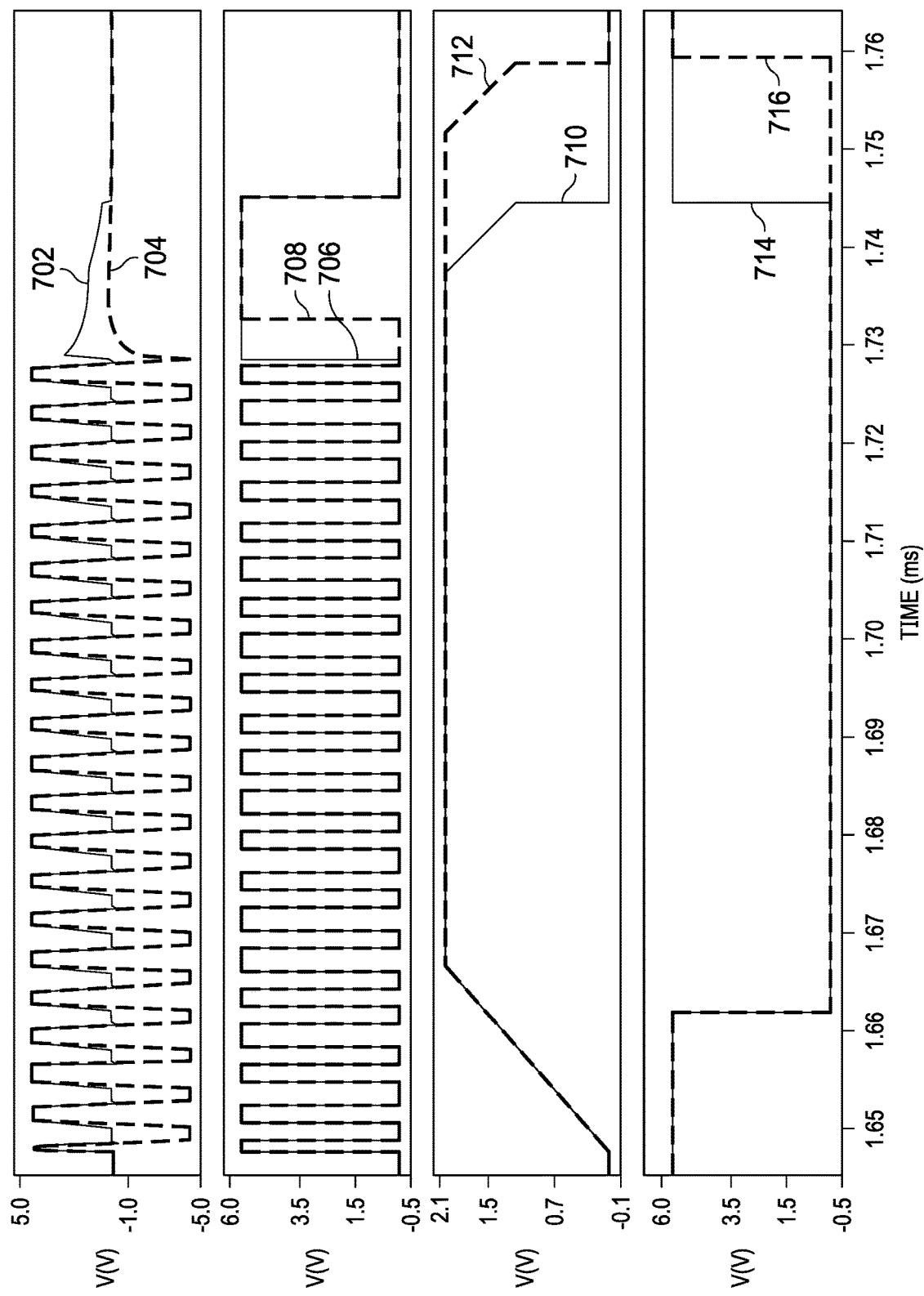

ON-OFF KEYING RECEIVERS

BACKGROUND

On-off keying COOK) is a signaling protocol that identifies a digital state of input data based on the type of signal that is transmitted. A first digital data state (e.g., a digital "0") might be signaled by transmitting a periodic signal. A second digital data state (a digital "1") might be signaled by transmitting no signal. An OOK receiver circuit detects the presence or absence of the periodic signal and decode a digital output signal therefrom. OOK signaling is used in a variety of application. For example, OOK signaling may be used in applications that employ isolation (e.g., capacitive isolation) between transmitter and receiver.

SUMMARY

An on-off keying (OOK) receiver with reduced duty cycle distortion is disclosed herein. In one example, an OOK receiver circuit includes a first input terminal, a second input terminal, a band-pass filter, and an envelope detector. The band-pass filter includes a high-pass filter, a low-pass filter, and a switch. The high-pass filter includes a first input coupled to the first input terminal, a second input coupled to the second input terminal, a first output; and, a second output. The low-pass filter includes a first input coupled to the first output of the high-pass filter, and a second input coupled to the second output of the high-pass filter. The switch includes a first terminal coupled to the first output of the high-pass filter, and a second terminal coupled to the second output of the high-pass filter. The envelope detector is coupled to the band-pass filter.

In another example, an OOK receiver circuit includes a band-pass filter and an envelope detector. The band-pass filter includes a high-pass filter, a low-pass filter, and a switch. The high-pass filter is configured to filter an OOK input signal. The low-pass filter is configured to filter an output signal of the high-pass filter. The switch is coupled to an output of the high-pass filter, and is configured to, with each cycle of the OOK input signal, dissipate energy stored in the band-pass filter. The envelope detector is configured to receive a filtered OOK input signal from the band-pass filter, and to generate an OOK output signal based on the filtered OOK input signal.

In a further example, a power line communication transceiver includes an OOK receiver circuit. The OOK receiver circuit includes a first input terminal, a second input terminal, a band-pass filter, and an envelope detector. The band-pass filter includes a high-pass filter, a low-pass filter, and a switch. The high-pass filter includes a first input coupled to the first input terminal, a second input coupled to the second input terminal, a first output, and a second output. The low-pass filter includes a first input coupled to the first output of the high-pass filter, and a second input coupled to the second output of the high-pass filter. The switch includes a first terminal coupled to the first output of the high-pass filter, a second terminal coupled to the second output of the high-pass filter, and a control terminal. The envelope detector is coupled to the band-pass filter, and includes a comparator. The comparator includes a first input coupled to the first output of the low-pass filter, a second input coupled to the second output of the low-pass filter, and an output coupled to the control terminal of the switch.

BRIEF DESCRIPTION OF THE DRAWINGS

For a detailed description of various examples, reference will now be made to the accompanying drawings in which:

FIG. 2 shows signal produced in the OOK receiver of FIG. 1;

FIG. 7 shows signal generated in an OOK receiver with the band pass filter of FIG. 6;

DETAILED DESCRIPTION

Figures 1, 3:
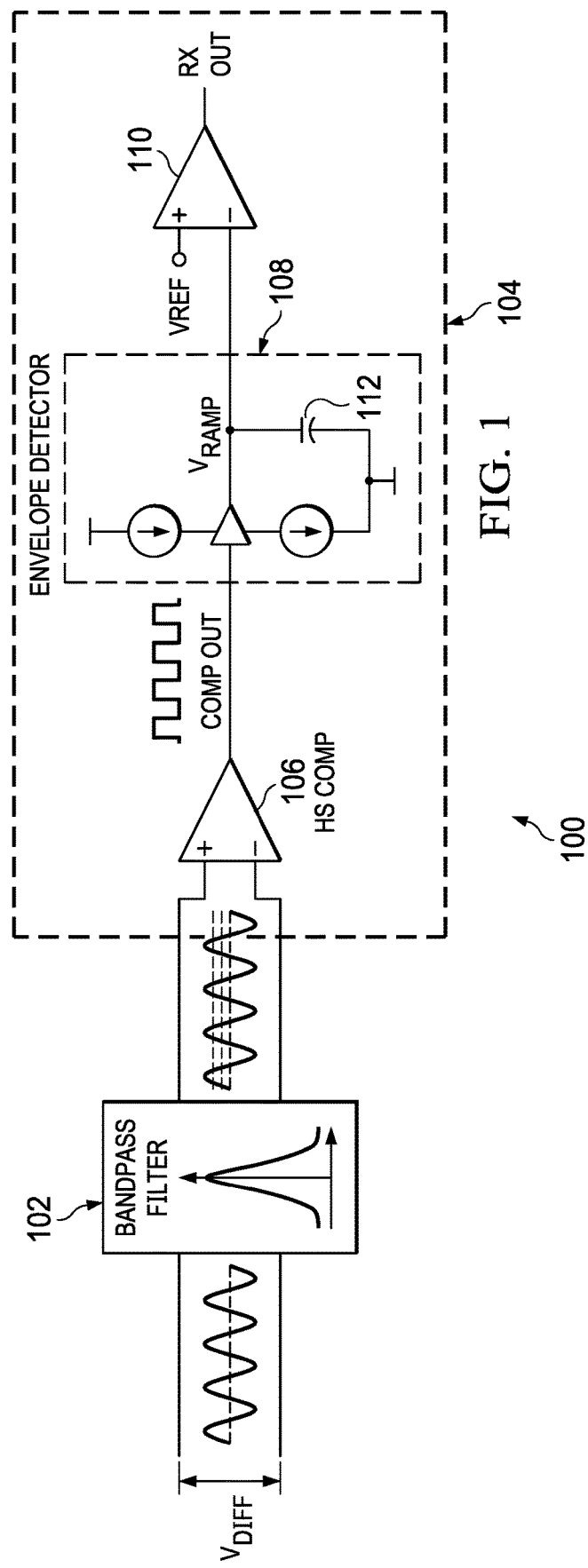
FIG. 1 shows a block diagram for an on-off keying (OOK) receiver that exhibits duty cycle distortion with high input signal amplitude.
FIG. 3 shows band-pass filter output of a last cycle of an OOK bit in the OOK receiver of FIG. 1 with low amplitude and high amplitude input signals.

FIG. 1 shows a block diagram for an on-off keying (OOK) receiver circuit 100 that exhibits duty cycle distortion with high input signal amplitude. The OOK receiver circuit 100 includes a band-pass filter 102 and an envelope detector 104. The OOK receiver circuit 100 processes input signals having a wide amplitude range (e.g., 100 millivolts to 5 volts). The range of carrier frequency processed by the OOK receiver circuit 100 may also be wide (e.g., 125 kilohertz to 5 megahertz). The band-pass filter 102 filters received signal to ensure that the OOK receiver circuit 100 generates output only for received signal within a band close to the selected carrier frequency (e.g. 100 KHz band around the selected carrier frequency). The envelope detector 104 is coupled to the band-pass filter 102, and includes a comparator 106, a ramp generator 108, and a comparator 110. The comparator 106 receives and digitizes the output signal of the band-pass filter 102. The ramp generator 108 is coupled to the comparator 106, and converts the pulses produced by the comparator 106 to a ramp signal by charging the capacitor 112 when the output of the comparator 106 is high and discharging the capacitor 112 when the output of the comparator 106 is low for $$\frac{1}{F_C},$$

more than where $F_c$ is the frequency of the carrier signal. The comparator 110 is coupled to the ramp generator 108. The comparator 110 compares the ramp signal produced by the ramp generator 108 to a threshold to generate output of the OOK receiver circuit 100.

In the OOK receiver circuit 100, the high Q of the band-pass filter 102 causes ringing at the output thereof. The output of the band-pass filter 102 continues to ring even after the input signal drops to zero (after signal transmission ends). The amplitude of ringing at the output of the band-pass filter 102 is proportional to the amplitude of signal input to the band-pass filter 102. Consequently, duty cycle distortion in the OOK receiver circuit 100 is a function of amplitude of signal input to the band-pass filter 102.

FIG. 2 shows signal produced in the OOK receiver circuit 100 with low and high amplitude input signal. The band-pass filter 102 outputs high amplitude signal 202 when the OOK receiver circuit 100 receives a high amplitude (5 volt) input signal, and outputs low amplitude signal 204 when the OOK receiver circuit 100 receives a low amplitude (100 millivolt) input signal. FIG. 3 shows high amplitude signal 202 and low amplitude signal 204 in interval 218. Ringing on the high amplitude signal 202 is significantly higher that on the low amplitude signal 204. The comparator 106 generates signal 208 based on the low amplitude signal 204, and generates signal 206 based on the high amplitude signal 202. The ringing on the high amplitude signal 202 in interval 218 causes the comparator 106 to generate pulse 207.

The ramp generator 108 generates ramp signal 210 based on the signal 208, and generates ramp signal 212 based on the signal 206. Because of the pulse 207, the ramp signal 212 is longer than ramp signal 210, and the bit 216 output by the comparator 110 is longer than the bit 214 output by the comparator 110. Thus, in the OOK receiver circuit 100, duty cycle distortion is greater with the high amplitude signal 202 than with the low amplitude signal 204.

Figure 4:
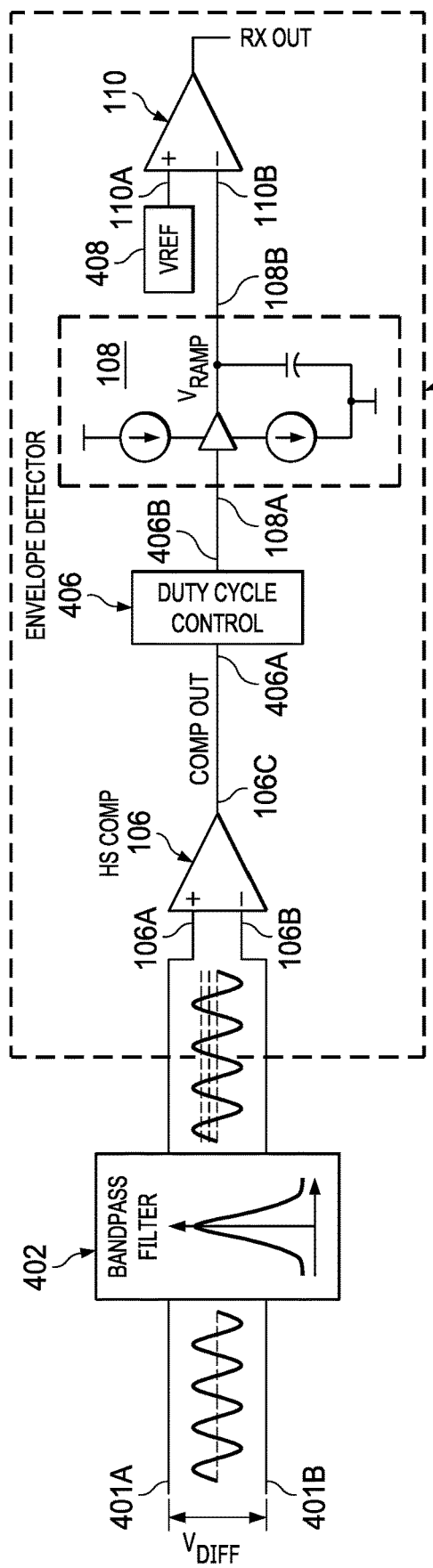
FIG. 4 shows a block diagram for an OOK receiver with duty cycle control.

FIG. 4 shows a block diagram for an OOK receiver circuit 400 that includes duty cycle control to reduce duty cycle distortion. The OOK receiver circuit 400 includes an input terminal 401A, and input terminal 401B, a band-pass filter 402, and an envelope detector 404. The band-pass filter 402 is similar to the band-pass filter 102 in some implementations of the OOK receiver circuit 400. The band-pass filter 402 is coupled to the input terminal 401A and the input terminal 401B for receipt of input signal. The band-pass filter 402 filters input signal to ensure that the OOK receiver circuit 400 produces output corresponding the input signal in a selected frequency band.

The envelope detector 404 is coupled to the band-pass filter 402. The envelope detector 404 includes the comparator 106, a duty cycle control circuit 406, the ramp generator 108, and the comparator 110. The comparator 106 receives and digitizes the output signal of the band-pass filter 402. The comparator 106 includes an input 106A coupled to the band-pass filter 402 and an input 1066 coupled to the band-pass filter 402. Output signal of the comparator 106 is provided to the duty cycle control circuit 406.

The duty cycle control circuit 406 receives output signal provided by the comparator 106, and limits the duration of logic high output signal (logic high time of the output signal) received from the comparator 106. For example, the duty cycle control circuit 406 limits the high time of a pulse received from the comparator 106 to about $$\frac{1}{2F_C},$$

where $F_C$ is the frequency of the carrier signal, in some implementations of the duty cycle control circuit 406. The duty cycle control circuit 406 includes a timing circuit that times the maximum duration of a logic high and a logic gate to block the pulse received from the comparator 106 if the width of the pulse exceeds the maximum duration. Thus, the duty cycle control circuit 406 limits the width of pulses provided to the ramp generator 108.

The duty cycle control circuit 406 includes an input 406A coupled to the output 106C of the comparator 106, and an output 406B coupled to the input 108A of the ramp generator 108. The ramp generator 108 includes an output 1086 coupled to the input 1106 of the comparator 110. The comparator 110 includes an input 110A coupled to the voltage reference circuit 408.

Figure 5:
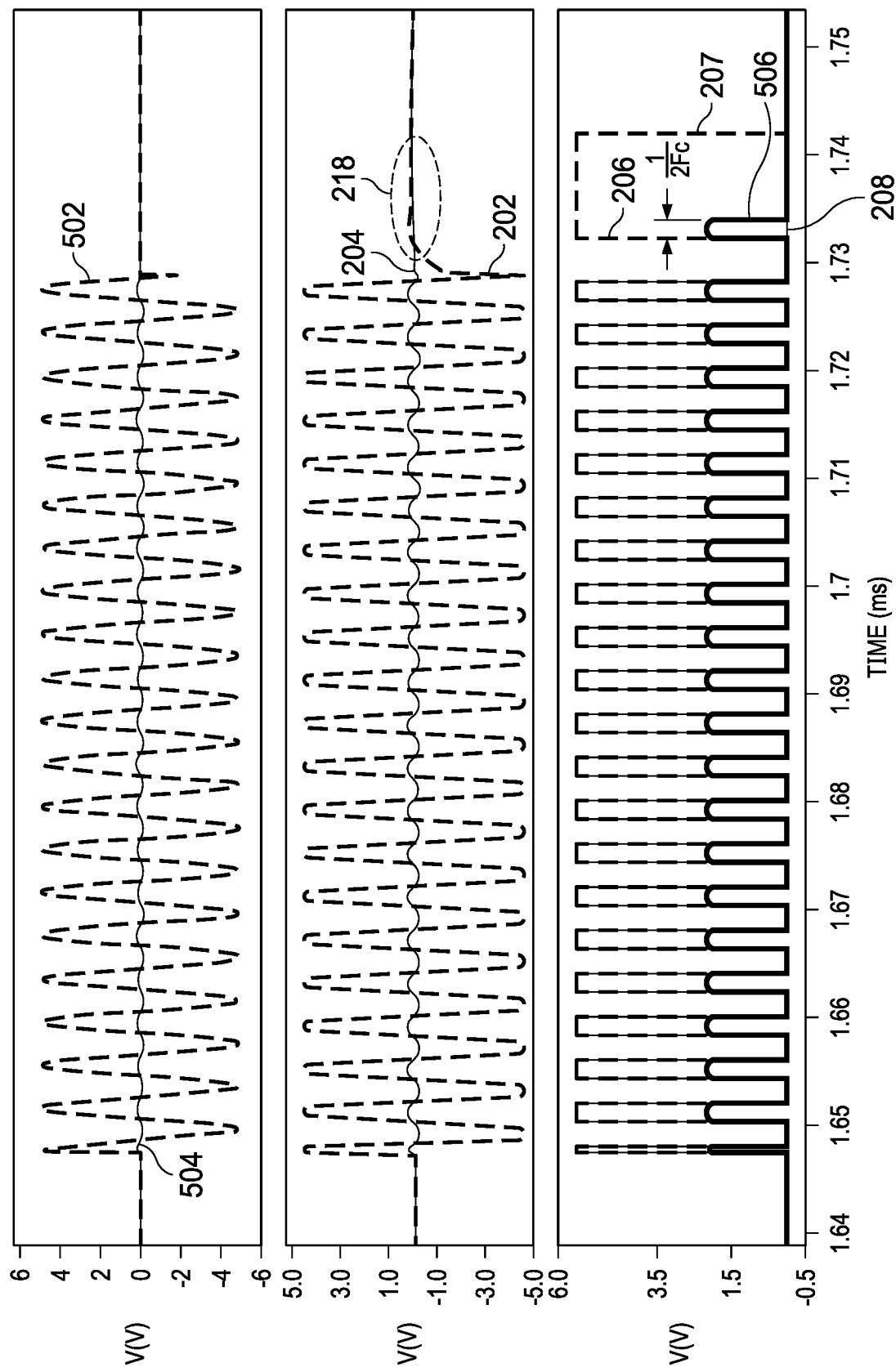
FIG. 5 shows signals in the OOK receiver of FIG. 4.

FIG. 5 shows signals in the OOK receiver circuit 400. Input signal 502 is a high amplitude signal received by the band-pass filter 402, and input signal 504 is a low amplitude signal received by the band-pass filter 402. When receiving the input signal 502, the band-pass filter 402 produces the high amplitude signal 202, and when receiving the input signal 504, the band-pass filter 402 produces the low amplitude signal 204. The high amplitude signal 202 includes ringing in the interval 218 as shown in FIG. 3. The comparator 106 produces signal 208 responsive to receipt of the low amplitude signal 204, and produces signal 206 responsive to the high amplitude signal 202. The duty cycle control circuit 406 shortens the pulse 207 to produce pulse 506, which substantially reduced the duty cycle distortion cause by receipt of the input signal 502.

Figure 6:
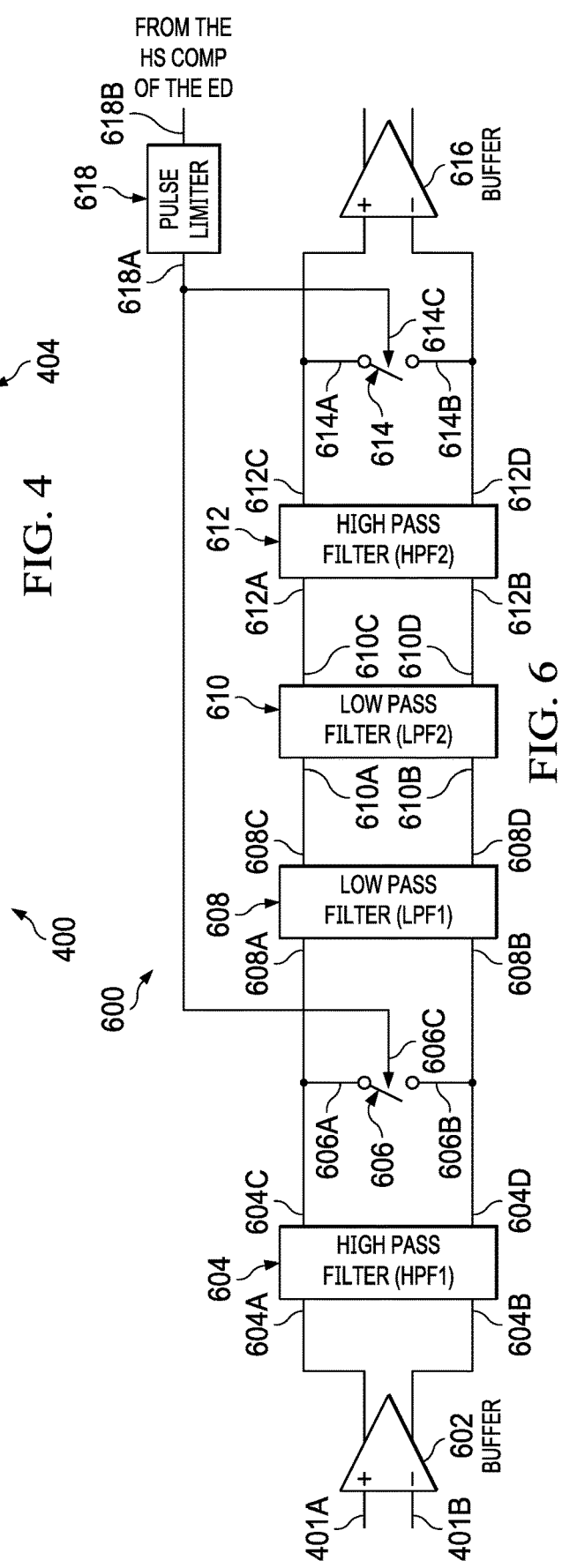
FIG. 6 shows a block diagram for a band-pass filter that reduces duty cycle distortion in an OOK receiver.

Some OOK receivers of the present disclosure provide duty cycle correction by applying de-Qing in the band-pass filter to reduce ringing. FIG. 6 shows a block diagram for a band-pass filter 600 that applies de-Qing to reduce duty cycle distortion in an OOK receiver. The band-pass filter 600 filters an OOK input signal, and includes an input buffer 602, a high-pass filter 604, a switch 606, a low-pass filter 608, a low-pass filter 610, a high-pass filter 612, a switch 614, and an output buffer 616. Various implementations of the band-pass filter 600 include any number or low-pass filter stages and high-pass filter stages coupled in series with buffers in between. The input buffer 602 drives the input signal received at the input terminal 401A and the input terminal 401B to the filter stages, and the output buffer 616 drives the filtered output signal to the comparator 106.

The high-pass filter 604 and the high-pass filter 612 are passive or active high-pass filters that attenuate frequencies above the band of interest. The low-pass filter 608 and the low-pass filter 610 are passive or active low-pass filters that attenuate frequencies below the band of interest. For example, the low-pass filters 608, 610 and the high pass filters 604, 612 are implemented as programmable passive resistor-capacitor filters followed by buffer circuitry is some implementations of the band-pass filter 600. The high-pass filter 604 includes an input 604A coupled to the input terminal 401A via the input buffer 602, and an input 604B coupled to the input terminal 401B via the input buffer 602. The low-pass filter 608 filters output signal of the high-pass filter 604, and includes an input 608A coupled to the output 604C of the high-pass filter 604, and an input 608B coupled to the output 604D of the high-pass filter 604. The switch 606 includes a terminal 606A coupled to the output 604C of the high-pass filter 604, a terminal 606B coupled to the output 604D of the high-pass filter 604, and a control terminal 606C coupled to the output 106C of the comparator 106 via a pulse limiter circuit 618. The pulse limiter circuit 618 generates a pulse at each falling edge of the output of the comparator 106. The pulse generated by the pulse limiter circuit 618 is about $$\frac{1}{2F_C}$$

in duration in some implementations. An implementation of the 618 includes a delay circuit to delay output of the comparator 106, and combinatorial logic to generate a pulse by combining the delayed and undelayed output of the comparator 106. An input 6186 of the pulse limiter circuit 618 is coupled to the output 106C of the comparator 106, and an output 618A of the pulse limiter circuit 618 is coupled to the control terminal 606C of the switch 606.

The low-pass filter 610 filters the output of the low-pass filter 608, and includes an input 610A coupled to an output 608C of the low-pass filter 608, and an input 6106 coupled to an output 608D of the low-pass filter 608. The high-pass filter 612 filters the output of the low-pass filter 610, includes an input 612A coupled to an output 610C of the low-pass filter 610, and an input 612B coupled to an output 610D of the low-pass filter 610. The high-pass filter 612 also includes an output 612C coupled to the input 106A of the comparator 106 via the output buffer 616, and an output 612D coupled to the input 106B via the output buffer 616. The switch 614 includes a terminal 614A coupled to the output 612C of the high-pass filter 612, a terminal 614B coupled to the output 612D of the high-pass filter 612, and a control terminal 614C coupled to the control terminal 606C of the switch 606.

The switch 606 and the switch 614 are closed to short the outputs of the high-pass filter 604 and the high-pass filter 612 for a time interval less than $$\frac{1}{2F_C}$$

when the output of the comparator 106 is a logic low, thereby removing excess residual energy from the band-pass filter 600 after each OOK clock cycle. Shorting the outputs of the high-pass filter 604 and the high-pass filter 612 with each cycle of the output of the comparator 106 removes energy from the band-pass filter 600 to ensure that ringing is not present at the output of the band-pass filter 600 at the end of a pulse train. The combination of pulse duration limiting in the duty cycle control circuit 406 and de-Qing provided by the switches 606 and 614 significantly reduces duty cycle distortion (e.g., reduced distortion by 30%) in some implementations. While the band-pass filter 600 has been illustrated as including a particular arrangement of high-pass filter stages and low-pass filter stages, implementations of the band-pass filter 600 include any arrangement of high-pass filter stages and low-pass filter stages.

FIG. 7 shows signal generated in an OOK receiver with high amplitude input signal with and without the band-pass filter 600. The band-pass filter 102 lacks de-Qing, and outputs the signal 704 which exhibits the ringing shown in FIG. 3. In contrast, the band-pass filter 600 outputs the signal 702. To generate the signal 702, the outputs of the high-pass filter 604 and high-pass filter 612 are shorted when the output of the comparator 106 is a logic low. Thus, the signal 702 does not go negative. The comparator 106 produces signal 706 responsive to the signal 702, and produces signal 708 responsive to the signal 704.

The ramp generator 108 generates ramp signal 712 based on the signal 708, and generates ramp signal 710 based on the signal 706. Because the ramp signal 712 is longer than ramp signal 710, the bit 716 output by the comparator 110 is longer than the bit 714 output by the comparator 110. Thus, the band-pass filter 600 reduces duty cycle distortion relative to the band-pass filter 102.

Figure 8:
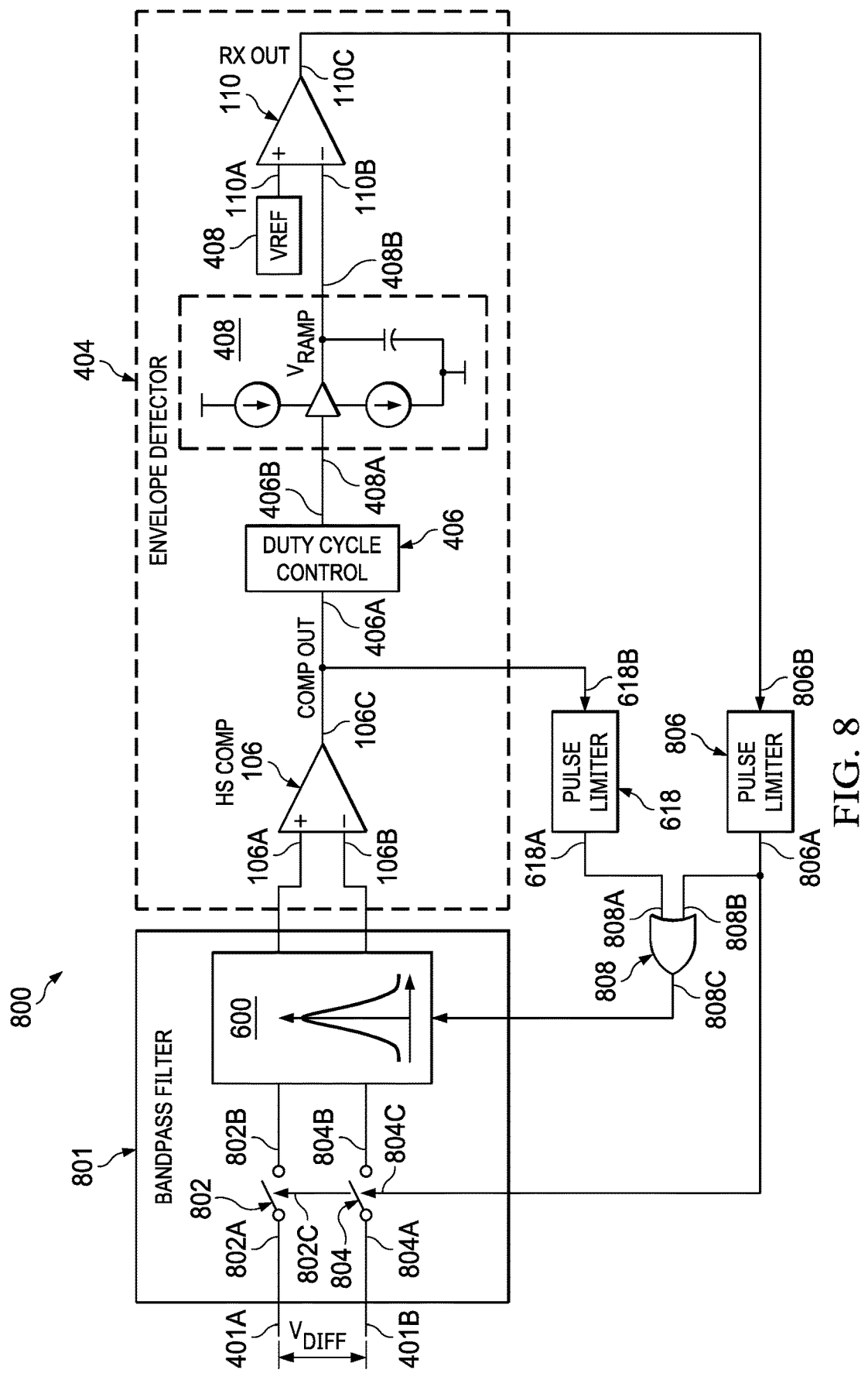
FIG. 8 shows a block diagram for an OOK receiver with the band-pass filter of FIG. 6 and duty cycle control.

FIG. 8 shows a block diagram for an OOK receiver 800. The OOK receiver 800 includes a band-pass filter 801, an envelope detector 404, a pulse limiter circuit 618, a pulse limiter circuit 806, and an OR gate 808. In the OOK receiver 800, inter-symbol interference in the OOK signal is suppressed by removing the energy from the band-pass filter 801 at the end of each data bit.

The band-pass filter 801 includes the band-pass filter 600, a switch 802, and a switch 804. The switch 802 and the switch 804 couple the input terminal 401A and the input terminal 401B to the band-pass filter 600 to route OOK input signal to the band-pass filter 801. The switch 802 and the switch 804 are opened when the switch 606 and the switch 614 are closed. The switch 802 includes a terminal 802A coupled to the input terminal 401A, a terminal 802B coupled to the input 604A of the high-pass filter 604, and a control terminal 802C. The switch 804 includes a terminal 804A coupled to the input terminal 401B, a terminal 804B coupled to the input 604B of the high-pass filter 604, and a control terminal 804C.

The pulse limiter circuit 806 is similar to the pulse limiter circuit 618, and includes an input 806B coupled to the output 110C of the comparator 110, and an output 806A coupled to the control terminal 804C of the switch 804 and the control terminal 802C of the switch 802. The pulse limiter circuit 806 generates a pulse at each falling edge at the output 110C of the comparator 110 to open the switches 802 and 804. The OR gate 808 includes an input 808A coupled to the output 618A of the pulse limiter circuit 618, an input 808B coupled to the output 806A of the pulse limiter circuit 806, and an output 808C coupled to the band-pass filter 600 (e.g., the control terminal 606C of the switch 606 and the control terminal 614C of the switch 614). The OR gate 808 combines the pulses produced by the pulse limiter circuit 618 and the pulse limiter circuit 806 to open the switches 606 and 614 at each falling edge at the output 106C of the comparator 106 or the output 110C of the comparator 110.

Figure 9:
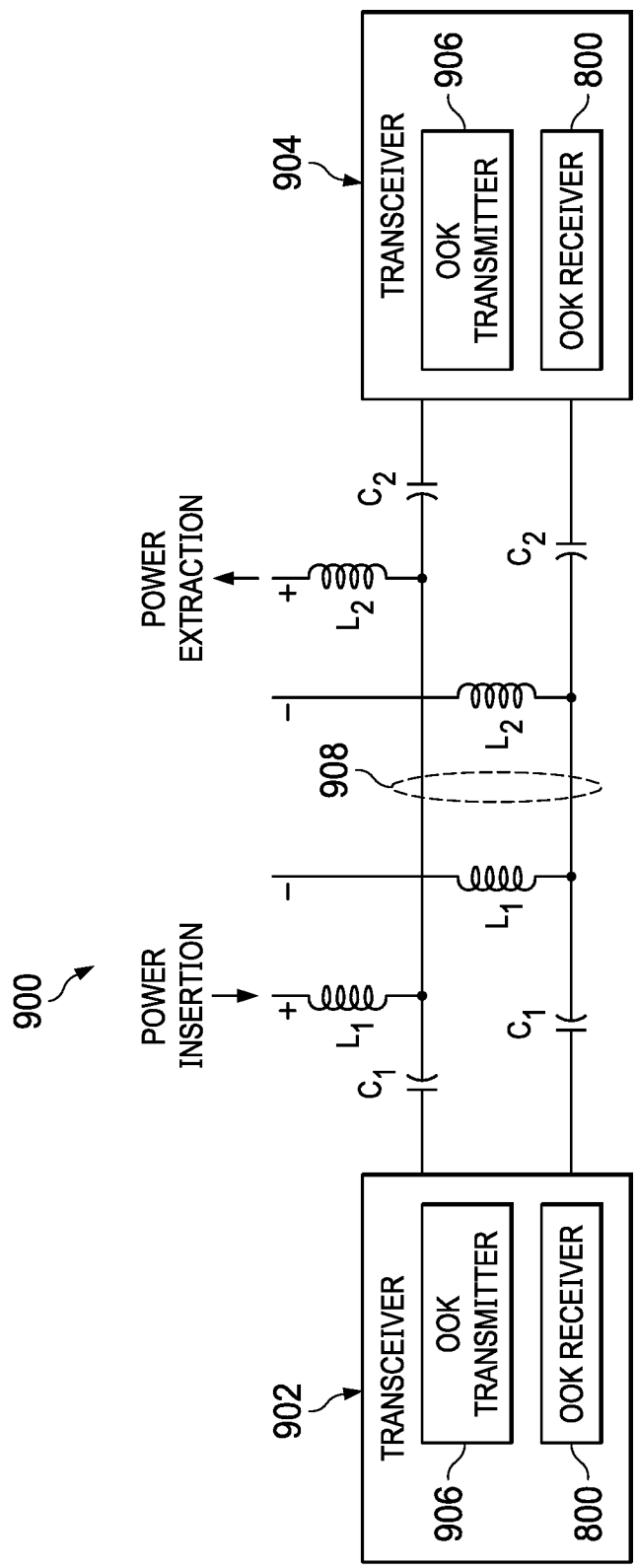
FIG. 9 shows a block diagram for a system that communicates using power line communication transceivers that include the OOK receiver of FIG. 8.

FIG. 9 shows a block diagram for a system 900 that communicates using power line communication transceivers. The system 900 includes a power line communication transceiver 902 and a power line communication transceiver 904 that communicate via power lines 908. For example, the power line communication transceiver 902 and the power line communication transceiver 904 are capacitively coupled to the power lines 908 via capacitors $C_1$ and $C_2$ in some implementations of the system 900. Power is applied to the power lines 908 via the inductors $L_1$, and extracted from the power lines 908 via the inductors $L_2$. The power line communication transceiver 902 includes an OOK transmitter 906 and an OOK receiver 800. The power line communication transceiver 904 is an instance of the power line communication transceiver 902 in some implementations of the system 900.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An on-off keying (OOK) circuit, comprising:
 a first input terminal;

a second input terminal;
a band-pass filter comprising:
  a high-pass filter comprising:
    a first input coupled to the first input terminal;
    a second input coupled to the second input terminal;
    a first output; and
    a second output;
  a low-pass filter comprising:
    a first input coupled to the first output of the high-pass filter; and
    a second input coupled to the second output of the high-pass filter; and
  a switch comprising:
    a first terminal coupled to the first output of the high-pass filter; and
    a second terminal coupled to the second output of the high-pass filter; and
  an envelope detector coupled to the band-pass filter;
wherein:
the switch comprises a control terminal; and
the envelope detector comprises:
  a comparator comprising:
    a first input coupled to the first output of the low-pass filter;
    a second input coupled to the second output of the low-pass filter; and
    an output coupled to the control terminal of the switch;
  wherein:
  the switch is a first switch; and
  the band-pass filter comprises:
    a second switch comprising:
      a first terminal coupled to the first input terminal;
      a second terminal coupled to the first input of the high-pass filter; and
      a control terminal; and
    a third switch, comprising:
      a first terminal coupled to the second input terminal;
      a second terminal coupled to the second input of the high-pass filter; and
      a control terminal.

2. The OOK circuit of claim 1, wherein:
the comparator is a first comparator; and
the envelope detector comprises:
  a duty cycle control circuit comprising:
    an input coupled to the output of the comparator; and
    an output;
  a ramp generator comprising:
    an input coupled to the output of the duty cycle control circuit; and
    an output;
  a second comparator comprising:
    a first input coupled to the output of the ramp generator;
    a second input coupled to reference voltage source; and
    an output terminal coupled to the control terminal of the second switch and the control terminal of the third switch.

3. An on-off keying (OOK) receiver circuit, comprising:
a first input terminal;
a second input terminal;
a band-pass filter comprising:
  a high-pass filter comprising:
    a first input coupled to the first input terminal;
    a second input coupled to the second input terminal;
    a first output; and
    a second output;
  a low-pass filter comprising:
    a first input coupled to the first output of the high-pass filter; and
    a second input coupled to the second output of the high-pass filter; and
  a switch comprising:
    a first terminal coupled to the first output of the high-pass filter; and
    a second terminal coupled to the second output of the high-pass filter; and
  an envelope detector coupled to the band-pass filter;
wherein:
the high-pass filter is a first high-pass filter; and
the low-pass filter is a first low-pass filter; and
the band-pass filter comprises:
  a second low-pass filter comprising:
    a first input coupled to a first output of the first low-pass filter;
    a second input coupled to a second output of the first low-pass filter;
    a first output; and
    a second output; and
  a second high-pass filter comprising:
    a first input coupled to the first output of the second low-pass filter;
    a second input coupled to the second output of the second low-pass filter;
    a first output; and
    a second output.

4. The OOK receiver circuit of claim 3, wherein:
the switch is a first switch; and
the band-pass filter further comprises:
  a second switch comprising:
    a first terminal coupled to the first output of the second high-pass filter;
    a second terminal coupled to the second output of the second high-pass filter; and
    a control terminal.

5. The OOK receiver circuit of claim 4, wherein:
the envelope detector comprises:
  a comparator comprising:
    a first input coupled to the first output of the second high-pass filter;
    a second input coupled to the second output of the second high-pass filter; and
    an output coupled to the control terminal of the second switch and a control terminal of the first switch.

6. An on-off keying (OOK) receiver circuit, comprising:
a band-pass filter comprising:
  a high-pass filter configured to filter an OOK input signal;
  a low-pass filter configured to filter an output signal of the high-pass filter; and
  a switch coupled to an output of the high-pass filter, and configured to, with each cycle of the OOK input signal, dissipate energy stored in the band-pass filter; and
an envelope detector configured to:
  receive a filtered OOK input signal from the band-pass filter; and
  generate an OOK output signal based on the filtered OOK input signal;
wherein the envelope detector comprises:

a comparator configured to detect the filtered OOK input signal, and control the switch; and
a duty cycle control circuit coupled to the comparator, and configured to limit a logic high time of an output signal of the comparator.

7. The OOK receiver circuit of claim 6, wherein:
the switch is a first switch; and
the band-pass filter comprises:
a second switch configured to switchably route the OOK input signal to the high-pass filter.

8. The OOK receiver circuit of claim 7, wherein:
the band-pass filter comprises:
a third switch configured to switchably route the OOK input signal to the high-pass filter.

9. The OOK receiver circuit of claim 8, wherein the comparator is configured to detect the filtered OOK input signal, and control the first switch, the second switch, and the third switch.

10. An on-off keying (OOK) receiver circuit, comprising:
a band-pass filter comprising:
a high-pass filter configured to filter an OOK input signal;
a low-pass filter configured to filter an output signal of the high-pass filter; and
a switch coupled to an output of the high-pass filter, and configured to, with each cycle of the OOK input signal, dissipate energy stored in the band-pass filter; and
an envelope detector configured to:
receive a filtered OOK input signal from the band-pass filter; and
generate an OOK output signal based on the filtered OOK input signal;
wherein:
the high-pass filter is a first high-pass filter; and
the low-pass filter is a first low-pass filter;
the switch is a first switch and
the band-pass filter comprises:
a second low-pass filter configured to low-pass filter an output signal of the first low-pass filter;
a second high-pass filter configured to high-pass filter an output signal of the second low-pass filter; and
a second switch coupled an output of the second high-pass filter, and configured to, with each cycle of the OOK input signal, dissipate energy stored in the band-pass filter.

11. A power line communication transceiver, comprising:
an on-off keying (OOK) receiver circuit, comprising:
a first input terminal;
a second input terminal;
a band-pass filter comprising:
a high-pass filter comprising:
a first input coupled to the first input terminal;
a second input coupled to the second input terminal;
a first output; and
a second output;
a low-pass filter comprising:
a first input coupled to the first output of the high-pass filter; and
a second input coupled to the second output of the high-pass filter;
a first output; and
a second output; and
a switch comprising:
a first terminal coupled to the first output of the high-pass filter;
a second terminal coupled to the second output of the high-pass filter; and
a control terminal; and
an envelope detector coupled to the band-pass filter, and comprising:
a comparator comprising:
a first input coupled to the first output of the low-pass filter;
a second input coupled to the second output of the low-pass filter; and
an output coupled to the control terminal of the switch;
wherein:
the switch is a first switch;
the comparator is a first comparator;
the envelope detector comprises:
a ramp generator coupled to the output of the first comparator;
a second comparator coupled to an output of the ramp generator; and
the band-pass filter comprises:
a second switch, comprising:
a first terminal coupled to the first input terminal;
a second input coupled to the first input of the high-pass filter; and
a control terminal coupled to an output of the second comparator.

12. The power line communication transceiver of claim 11, wherein the band-pass filter comprises:
a third switch, comprising:
a first terminal coupled to the second input terminal;
a second input coupled to the second input of the high-pass filter; and
a control terminal coupled to the output of the second comparator.

13. The power line communication transceiver of claim 12, further comprising:
a pulse limiter circuit comprising:
an input coupled to the output of the second comparator; and
an output coupled to the control terminal of the first switch, the control terminal of the second switch, and the control terminal of the third switch.

14. A power line communication transceiver, comprising:
an on-off keying (OOK) receiver circuit, comprising:
a first input terminal;
a second input terminal;
a band-pass filter comprising:
a high-pass filter comprising:
a first input coupled to the first input terminal;
a second input coupled to the second input terminal;
a first output; and
a second output;
a low-pass filter comprising:
a first input coupled to the first output of the high-pass filter; and
a second input coupled to the second output of the high-pass filter;
a first output; and
a second output; and
a switch comprising:
a first terminal coupled to the first output of the high-pass filter;
a second terminal coupled to the second output of the high-pass filter; and
a control terminal; and an envelope detector coupled to the band-pass filter, and comprising:
a comparator comprising:
a first input coupled to the first output of the low-pass filter;
a second input coupled to the second output of the low-pass filter; and
an output coupled to the control terminal of the switch; wherein the envelope detector comprises:
a duty cycle control circuit comprising an input coupled to the output of the comparator, the duty cycle control circuit configured to limit a logic high time of an output signal of the comparator.

15. A power line communication transceiver, comprising:
an on-off keying (OOK) receiver circuit, comprising:
a first input terminal;
a second input terminal;
a band-pass filter comprising:
a high-pass filter comprising:
a first input coupled to the first input terminal;
a second input coupled to the second input terminal;
a first output; and
a second output;
a low-pass filter comprising:
a first input coupled to the first output of the high-pass filter; and
a second input coupled to the second output of the high-pass filter;
a first output; and
a second output; and
a switch comprising:
a first terminal coupled to the first output of the high-pass filter;
a second terminal coupled to the second output of the high-pass filter; and
a control terminal; and an envelope detector coupled to the band-pass filter, and comprising:
a comparator comprising:
a first input coupled to the first output of the low-pass filter;
a second input coupled to the second output of the low-pass filter; and
an output coupled to the control terminal of the switch; wherein:
the high-pass filter is a first high-pass filter; and
the low-pass filter is a first low-pass filter; and
the band-pass filter comprises:
a second low-pass filter comprising:
a first input coupled to a first output of the first low-pass filter;
a second input coupled to a second output of the first low-pass filter;
a first output; and
a second output; and
a second high-pass filter comprising:
a first input coupled to the first output of the second low-pass filter;
a second input coupled to the second output of the second low-pass filter;
a first output; and
a second output.

16. The power line communication transceiver of claim 15, wherein:
the switch is a first switch; and
the band-pass filter further comprises:
a second switch comprising:
a first terminal coupled to the first output of the second high-pass filter;
a second terminal coupled to the second output of the second high-pass filter; and
a control terminal coupled to the output of the comparator.

\* \* \* \* \*